United States Patent [19]

Rozanski, Jr. et al.

[11] Patent Number: 4,703,520

[45] Date of Patent: Oct. 27, 1987

[54] RADIO TRANSCEIVER HAVING AN ADAPTIVE REFERENCE OSCILLATOR

[75] Inventors: Walter J. Rozanski, Jr., Hurst; Kevin M. Laird, Haltom City, both of Tex.

[73] Assignee: Motorola, Inc., Schaumburg, Ill.

[21] Appl. No.: 925,768

[22] Filed: Oct. 31, 1986

[51] Int. Cl.⁴ ............................................. H04B 1/40
[52] U.S. Cl. ........................................ 455/75; 455/76; 455/182; 455/183; 455/260; 331/25
[58] Field of Search ..................................... 455/75–77, 455/182, 183, 260, 265, 208, 209; 331/18, 25, 1 A

[56] References Cited

U.S. PATENT DOCUMENTS

| | | | |
|---|---|---|---|
| 3,509,462 | 4/1970 | Ertman | 455/75 |
| 4,153,884 | 5/1979 | Tkeguchi et al. | 455/76 |
| 4,188,582 | 2/1980 | Cannalte et al. | |
| 4,348,772 | 9/1982 | Leland et al. | 455/260 |
| 4,451,930 | 5/1984 | Chapman et al. | 455/260 |
| 4,513,447 | 4/1985 | Carson | 455/76 |
| 4,596,046 | 6/1986 | Richardson et al. | 455/260 |

Primary Examiner—Jin F. NG
Attorney, Agent, or Firm—Steven G. Parmelee

[57] ABSTRACT

A reference oscillator (21) suitable for use in a radio transceiver having a phase locked loop FM detector (12). During normal reception operation, the reference oscillator (21) can be controlled in closed loop manner through use of a phase locked loop that responds, in part, to the lock frequency of the FM detector phase locked loop. During transmit functions, or during other periods when the closed loop control may not provide accurate reference oscillator (21) operation, open loop control can be provided instead. Open loop control includes use of a stored value that reflects a most recent reliable value of an appropriate input control signal for the reference oscillator (21).

17 Claims, 7 Drawing Figures

RADIO TRANSCEIVER HAVING AN ADAPTIVE REFERENCE OSCILLATOR

TECHNICAL FIELD

This invention relates generally to radio communications transceivers, and particularly to reference oscillators as used in such transceivers.

BACKGROUND ART

A radio transceiver has an ability to both receive and transmit information modulated on a carrier frequency. In general, to provide satisfactory performance, the carrier frequency must be predetermined. In many radios, the carrier frequency used for transmission may be identical to, or may otherwise be a function of, the carrier frequency used for reception.

During reception, a radio can ordinarily compensate for various internal frequency errors (caused, for instance, by component tolerances, age, or temperature) by use of various prior art frequency locking techniques. In general, a receiving radio need only start in the general vicinity of the carrier frequency it seeks to receive, and a locking mechanism, such as a phase locked loop, can be used to precisely locate the reception frequency.

During transmission, however, different circumstances prevail. The carrier frequency transmitted by the radio must be as precise as possible. In a base station radio, this can be accomplished in many ways, including the use of high tolerance (and expensive) components, redundant (and expensive) calibrating and monitoring circuits, and the like. In a mobile radio transceiver, however, where space and cost parameters are very important to the end user, such remedies are often not available. Therefore, the problems of maintaining a correct transmission frequency are greater.

Most of the frequency spectrum dedicated by the Federal Communications Commission to land mobile usage has channel spacing of 25 kHz. Generally available components can be, and are, used in today's mobile radios with reasonable success as regards accuracy of the transmission frequency. Though typically not as accurate as a base station transmission, the width of the channel spacing provided enough latitude to ensure reasonable performance.

In some of the spectrum dedicated by the FCC to land mobile usage, however, the FCC has mandated that channel spacing must be 12.5 kHz instead of the traditional 25 kHz. With such narrow channel spacing, the importance of maintaining a correct transmission frequency has increased.

There therefore exists a need for a means of providing accurate transmission frequencies in a mobile radio. The desired mechanism should not contribute unduly to the expense of the radio nor its complexity of operation. Further, the desired mechanism should not greatly impair the manufacturing process or serviceability of the radio.

SUMMARY OF THE INVENTION

These needs and others are substantially met through provision of the adaptive reference oscillator disclosed herein. This adaptive reference oscillator operates in conjunction with a radio transceiver that includes a phase locked loop FM detector. The output of the VCO associated with the FM detector passes through a programmable resettable counter to a phase frequency detector, where the VCO signal can be compared with a properly conditioned signal from a reference oscillator. The reference oscillator itself provides a signal that can be used to provide an injection signal to the IF mixer for reception purposes, and that can be used by the radio in establishing a transmission carrier frequency.

The output of the phase frequency detector passes through a loop filter, which in turn controls the output of the reference oscillator in phase locked loop fashion. In addition, however, a number of switches are provided to allow selective rerouting of the loop filter output and the reference oscillator input. In particular, the output of the loop filter can be routed to a memory stage, where comparisons of the current loop filter output can be made with historical readings of this same output. In addition, the stored historical reading can be updated from time to time to maintain a current indication of what the current loop filter output ought to approximate.

In operation, the phase locked loop associated with the reference oscillator functions in closed loop manner, with the output of the loop filter controlling the output frequency of the reference oscillator (if desired, a limit control stage can be added to prevent the reference oscillator from exceeding certain preestablished frequency boundaries). During transmission, however, the reference oscillator can function in an open loop manner by using the stored loop filter output from the memory stage. The value stored in the memory stage comprises a value based on past behavior of the loop filter as influenced by the phase frequency detector. As a result, the transmission frequency remains very accurate since aberations that might ordinarily arise due to component tolerance, age, or temperature are compensated for by allowing the transmission frequency to be governed as a function of the reception frequency. Since the latter frequency will ordinarily be controlled accurately by a base station, the transmission frequency as based thereon will also remain quite accurate.

Certain safeguards can be provided to assure proper performance. For example, a low pass filter can be used to average the loop filter output prior to processing by the memory stage. This assures that short, transient aberations in the signal will not significantly affect the operation of the invention. Further, while receiving, the loop filter output can be compared against the stored value, and if the comparison indicates a value outside an acceptable range, the stored value can be provided to the reference oscillator in lieu of the actual loop filter output during reception. Also, the invention can be made sensitive to a long term presence of an extreme loop filter output value during reception, that, while not out of range as described above, is still indicative of a problem due to its longevity. Still further, the invention can be made sensitive to a squelch detect signal, an out of lock indicator signal, and other pertinent signals, by substituting the stored value for the real time value and by preventing any subsequent updates of the stored value until the problem event has concluded.

BRIEF DESCRIPTION OF THE DRAWINGS

These and other attributes of the invention will become more clear upon making a thorough review and study of the following description of the best mode for carrying out the invention, particularly when reviewed in conjunction with the drawings, wherein.

BEST MODE FOR CARRYING OUT THE INVENTION

Figure 1:
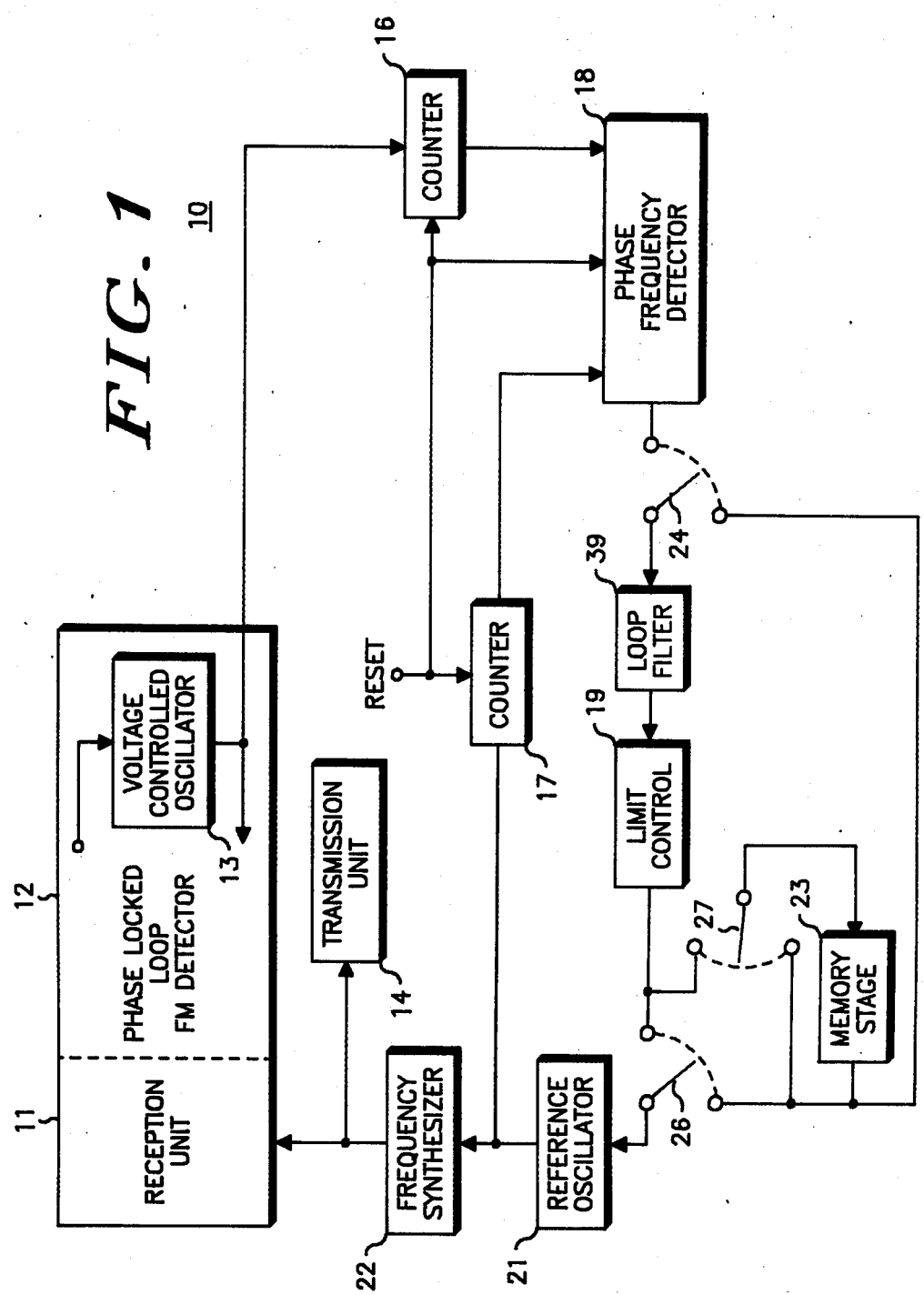
FIG. 1 comprises a block diagram view of the invention as configured in conjunction with a radio.

Referring now to the drawings, and in particular to FIG. 1, the invention can be seen as depicted generally by the numeral 10. The invention has been depicted in conjunction with a radio transceiver having a reception unit (11) that includes a phase locked loop FM detector (12) having a voltage controlled oscillator (VCO) (13). The radio further includes a transmission unit (14) for allowing modulated signals to be broadcast on a transmission carrier frequency. Such generally referred to components are well understood in the prior art, and hence no additional description need be provided here except as may be necessary to indicate interaction between these typical components of a radio tranceiver and the invention (10).

With continued reference to FIG. 1, the invention (10) includes generally first and second counters (16 and 17), a phase frequency detector (18), a loop filter (39), a limit control (19), a reference oscillator (21), a frequency synthesizer (22), a memory stage (23), and 3 switches (24, 26, and 27). In general, the reference oscillator (21) provides a signal to the frequency synthesizer (22) that can be utilized by the reception unit (11) for reception purposes and by the transmission unit (14) for transmission purposes. The reference oscillator (21) can be operated in either a closed loop configuration with a phase locked loop that includes the second counter (17), the phase frequency detector (18), the loop filter (39), and the limit control (19), or an open loop control as based upon an input from the memory stage (23), depending upon the status of the 3 switches (24, 26, and 27). The memory stage (23) functions to develop and retain a value that reflects a long term reliable middle value of the loop filter (39) output and also to store a most recent reliable value for this output. This latter stored value can then be utilized by the reference oscillator (21) during, among other times, transmission. In effect, the reliability and precision of the incoming reception signal can be utilized to provide a value that can be later retrieved for use in providing an accurate transmission frequency.

Each of the above generally referred to components will now be described in more detail in seriatim fashion.

Figure 2:
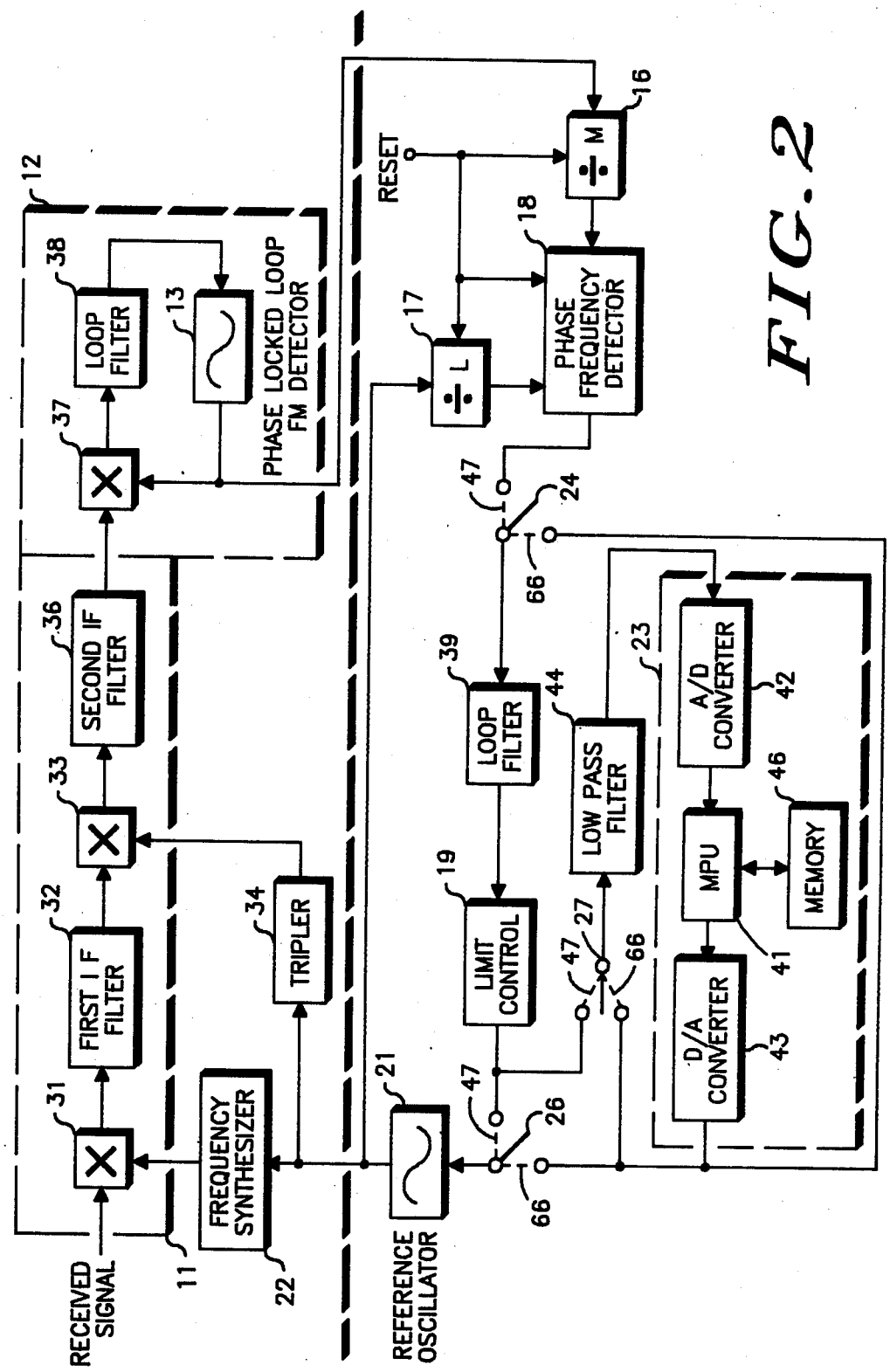
FIG. 2 comprises a more detailed block diagram view of the invention.

Referring now to FIG. 2, the reception unit (11) can include a first mixer (31) that receives an FM modulated carrier frequency signal and an injection signal from the frequency synthesizer (22). In accordance with well understood prior art technique, the output of the mixer (31) comprises a signal having a first IF stage frequency and having the FM modulated information modulated thereon. This signal passes through a first IF filter (32) to the input of a second mixer (33) which receives a second injection signal (which, in this embodiment, comprises the reference oscillator (21) output as passed through a tripler (34)).

The output of the second mixer (33) comprises the information component as modulated on a second IF frequency carrier, which passes through a second IF filter (36) to the input of a third mixer (37). This mixer (37) comprises a part of a phase locked loop FM detector (12) that includes, in accordance with well understood prior art technique, a loop filter (38) and a voltage controlled oscillator (VCO) (13). The output of the phase locked loop FM detector can then be processed through subsequent analog or digital circuitry (not shown) to render the demodulated information suitable for use as intended by the operator in accordance with well understood prior art technique.

The output of the FM detector VCO (13) also connects to the input of the first counter (16), which in this embodiment functions as a divider. The output of the first counter (16) passes to one input of the phase frequency detector (18), the output of which connects to the first switch (24) described above. This switch (24) also connects through a loop filter (39) (which generally provides an integrating function) and a limit control (19) to the second switch (26) and the input of the reference oscillator (21). The output of the reference oscillator (21) connects operably to the reception unit (11) and the transmission unit (14) as described above, and also to the input of the second counter (17). The second counter (17) functions to divide the frequency of the incoming signal from the reference oscillator (21) by a predetermined amount (L) before providing that divided down signal to the remaining input of the phase frequency detector (18). Both counters (16 and 17) can be reset to zero by appropriate control of a reset port provided with both counters (16 and 17).

The memory stage (23) can be comprised of a microprocessor (41) having an input appropriately connected to an analog to digital converter (42) and an output connected to a digital to analog converter (43). The input to the analog to digital convertor (42) may be connected through a lowpass filter (44) (having, for instance, a corner frequency of 1 Hz) to the third switch (27), which switch (27) also connects between the output of the limit control (19) and the output of the digital to analog converter (43). The output of the digital to analog converter also connects to the second switch (26) and the first switch (24). Finally, the memory stage (23) can also include external memory (46) that operates in conjunction with the microprocessor (41), to the extent that the microprocessor does not have sufficient on-board non-volatile memory.

When all three switches (24, 26, and 27) are in a first conductive state (represented in FIG. 2 by the phantom lines denoted by the numeral 47), the reference oscillator (21) will essentially function in a closed loop manner with an incoming control signal being provided by the loop filter (39) as based upon phase frequency differences between the output of the reference oscillator (21) and the output of the phase locked loop FM detector VCO (13). The limit control (19) can be provided to limit to some predetermined degree the extent to which the output control of the loop filter (39) may cause a commensurate variation in frequency at the output of the reference oscillator (21). Nevertheless, the reference oscillator (21) will still essentially function in a closed loop manner. At the same time, the input to the reference oscillator (21) will also be provided through the lowpass filter (44) to the memory stage (23) where it will be digitized and appropriately processed by the microprocessor.

Figure 5B:
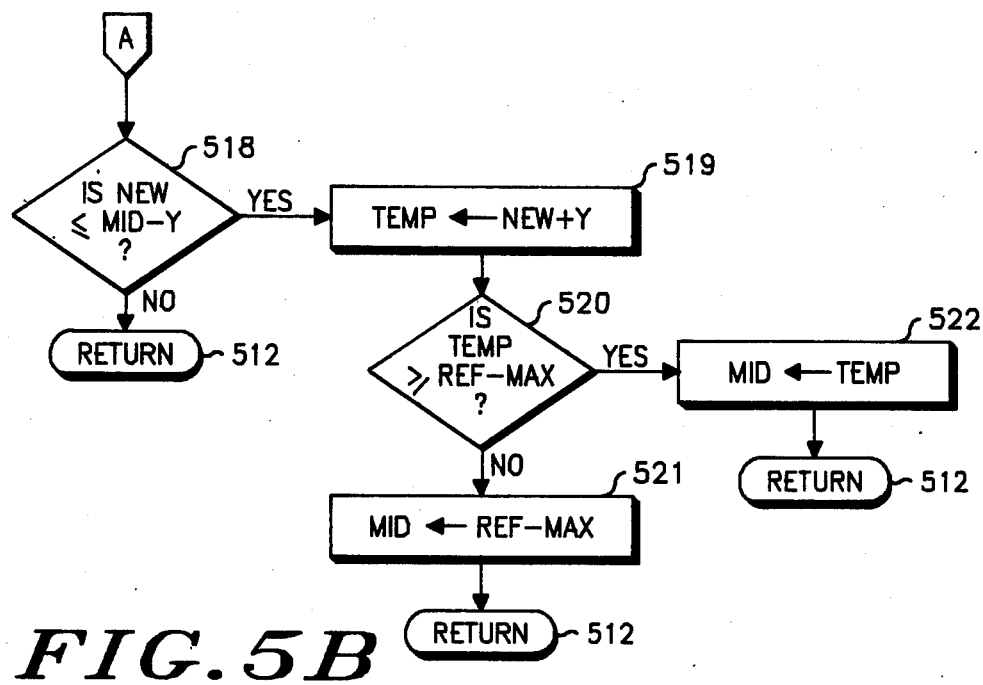
FIGS. 5a and b comprise a flow chart depicting partial operation of the invention.
Figure 5A:
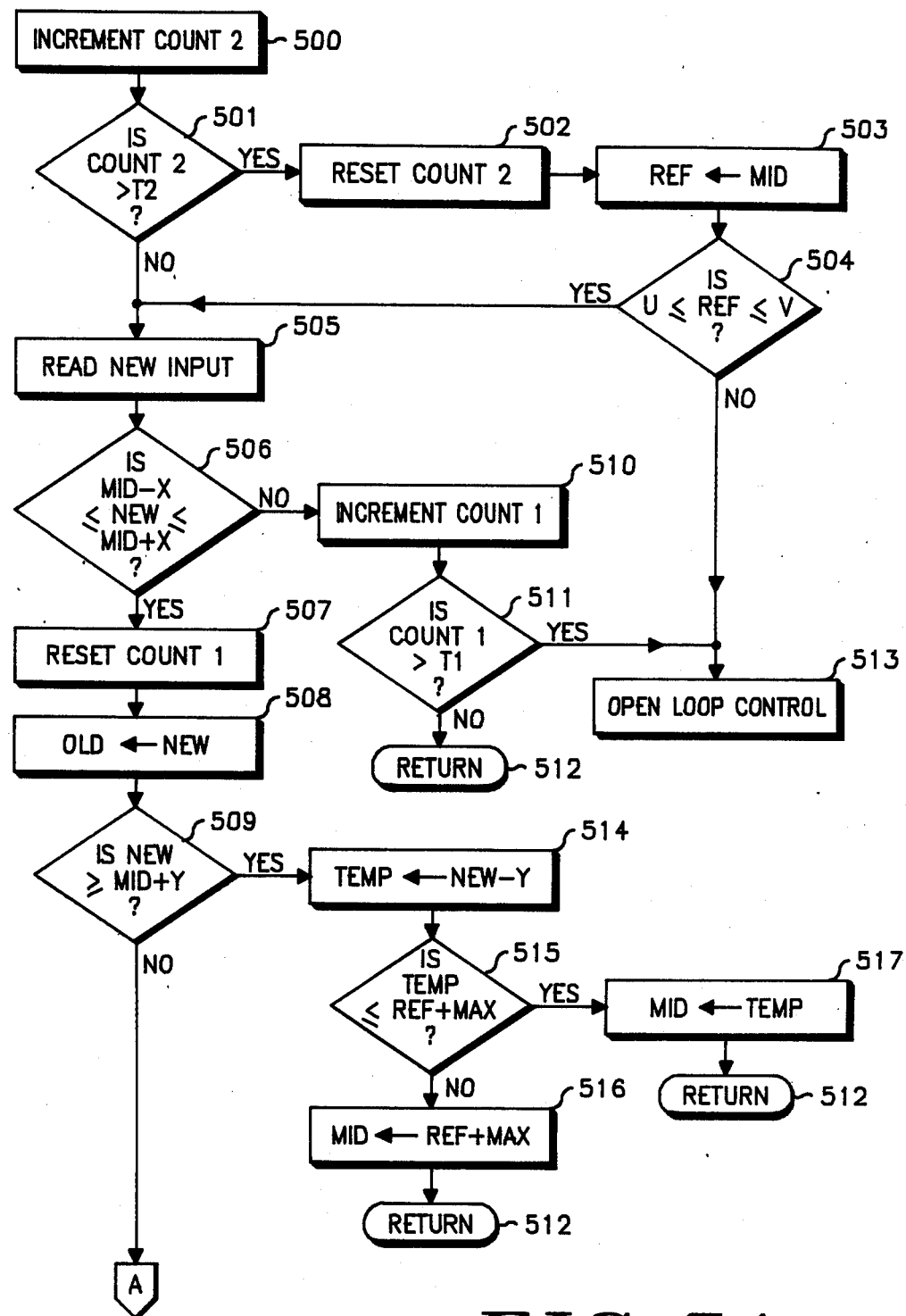

Referring now momentarily to FIG. 5, general operation of the microprocessor (41) with respect to the incoming information from the analog to digital converter (42) will now be described.

The microprocessor (41) first increments a predetermined count (COUNT 2) (500) and determines whether this count exceeds a predetermined value (T2) (501). In essence, this provides the microprocessor (41) with information as to whether enough time has passed to justify updating the stored reference value (REF). If COUNT 2 does exceed T2, COUNT 2 is reset to zero (502) and the reference value REF is updated with the most recently estimated middle value (MID) that relates to the loop filter (39) output (503). Following establishment of a new REF value, the microprocessor (41) determines whether the new REF value falls within a predetermined range defined by an upper limit (V) and a lower limit (U) (504). If the new REF value falls outside the indicated range, the microprocessor (41) establishes open loop control of the reference oscillator (513).

Assuming that the new REF value proves acceptable pursuant to the above noted test, or in the event that COUNT 2 does not exceed T2, the microprocessor (41) next reads the current loop filter (39) output (NEW) (as filtered, of course, through the low pass filter (44) and as digitized by the analog to digital converter (42)) (505). A determination is then made as to whether the new reading (NEW) exceeds a specific range (506) having an upper range equaling the MID value plus a first constant (X) and a lower range equaling the MID value less the same first constant (X). If the NEW does exceed these limits, the microprocessor (41) increments a count (COUNT 1) (510) and then determines whether this count (COUNT 1) exceeds a predetermined value (T1) (511). If it does, then open loop control (513) will result. Otherwise, the subroutine RETURNs as desired by the programmer.

If effect, the above programming allows the microprocessor (41) to determine if the control signal has exceeded an adaptive range for a predetermined period of time. If this range has been so exceeded, the microprocessor (41) reverts to open loop control of the reference oscillator (21). Otherwise, closed loop control continues.

If the NEW reading does not exceed the above noted range (506), the microprocessor (41) next resets COUNT 1 (507) and the NEW value is stored in memory as the most recent reliable value (OLD) (508) for subsequent use as an open loop control signal for the reference oscillator (21). Following this, the microprocessor (41) determines whether the NEW value exceeds a threshold related to the MID value plus a second constant (Y) (509), which second constant (Y) is less in value than the first constant (X). If the NEW value does exceed this threshold, the microprocessor (41) creates a temporary value (TEMP) that constitutes an estimate of a possible new MID value (514). To accomplish this, TEMP is made equal to the NEW value less the second constant (Y).

If the TEMP value exceeds a threshold value comprised of the REF value plus a predetermined permissible constant (MAX) (515) (which constant (MAX) is less in value than either the first or second constants (X and Y)), the threshold value itself becomes the new MID value (516) and the routine RETURNs (512). Otherwise, the TEMP value becomes the new MID value (517) and the routine RETURNs (512).

If the NEW value does not exceed the MID plus Y threshold pursuant to the above noted test (509), the microprocessor then determines whether the NEW value is less than a threshold represented by the MID value less the second constant (Y) (518). If not, the routine RETURNs (512) as desired by the programmer. Otherwise, however, the microprocessor (41) creates a temporary value TEMP by adding the second constant (Y) to the NEW value (519). If this TEMP value exceeds a threshold value comprised of the REF value less the permissible constant (MAX), the TEMP value becomes the new MID value (522) and the routine RETURNs (512). Otherwise, the MID value becomes the REF value less the permissible constant (MAX) (521) and the routine RETURNs (512).

Pursuant to the above configuration, the microprocessor (41) can implement open loop control whenever the control signal falls outside a permissible range, with the range itself being dynamically established from time to time to account for aging of relevant components and other factors.

Referring again to FIG. 2, when the 3 switches (24, 26, and 27) are in a second conductive state (as depicted by the phantom lines denoted by the numeral 66), the loop filter (39) output no longer provides information to either the memory stage (23) or the reference oscillator (21). Instead, the microprocessor (41) provides the OLD information value representing the most recent reliable value of the loop filter (39) output through the second switch (26). Also, the OLD information is provided through the first switch (24) to the loop filter (39) to maintain the values in the loop filter (39) at their most recent reliable value. The reference oscillator (21) uses this value in an open loop manner to provide a controlled frequency output that can be used by the reception unit (11) or the transmission unit (14) (FIG. 1) as appropriate.

As will be made apparent further below, the first and second switches (24 and 26) are operated in a different time frame than the third switch (27). The difference provided, and the purpose of providing this difference, will be made more apparent below.

Figure 3:
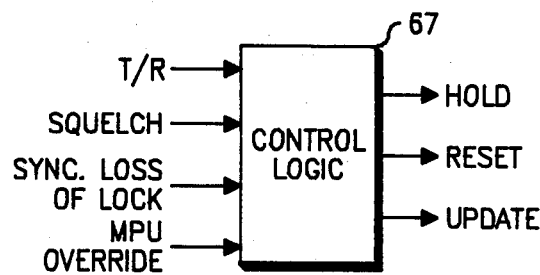
FIG. 3 comprises a block diagram view of the control signal feature of the invention.

Referring now to FIG. 3, a control logic block (67) receives various information signals and outputs a hold signal for controlling the first and second switches (24 and 26), a reset signal for resetting the first and second counters (16 and 17) and the phase frequency detector (18), and an update signal for controlling the third switch (27).

Figure 4:
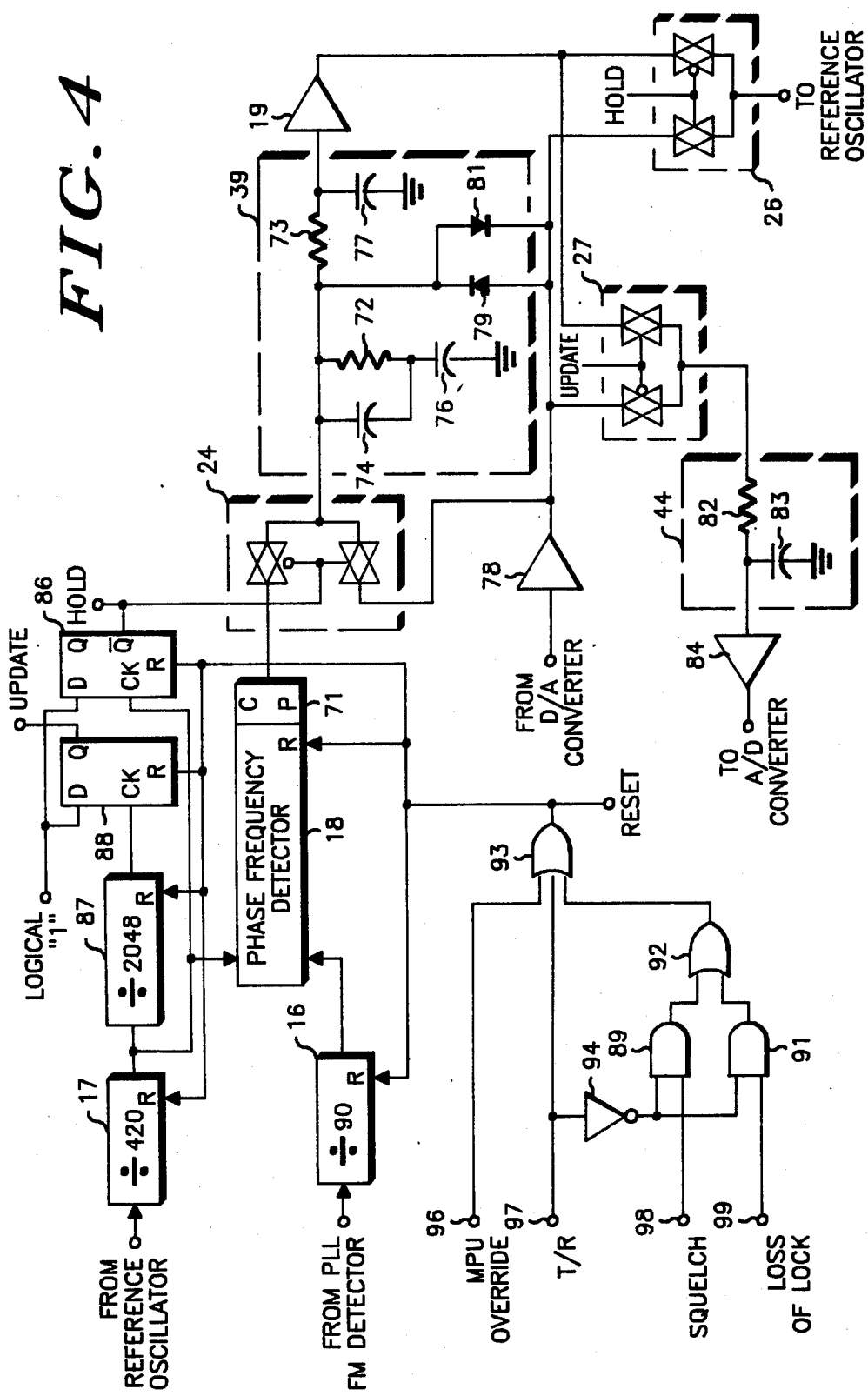
FIG. 4 comprises a schematic view of the invention.

Referring now to FIG. 4, a more precise description of certain aspects of the invention, including the control logic (67), will be provided. The first counter (16) may be provided through use of a divide-by-90 counter, and the second counter (17) may be provided through use of a divide-by-420 counter, both components being well recognized and understood in the art. The outputs from both counters (16 and 17) may be provided to the inputs of a phase frequency detector (18) having a charge pump output (71).

As described earlier, the output of the phase frequency detector (18) (which can be comprised of a charge pump, as in this embodiment) connects through the first switch (24) to a loop filter (39). In this embodiment, the loop filter (39) includes 2 resistors (72 and 73) and 3 capacitors (74, 76, and 77) configured as depicted to provide appropriate filtering functions and transient response as regards the operation of the reference oscillator control phase locked loop. The output of the loop filter (39) connects through the buffer amplifier (19) to the second switch (26) which, of course, connects to the reference oscillator (21) as described above.

Also as described above, the digital to analog converter (43) (FIG. 2) connects to the second switch (26) (in this embodiment through a buffer amplifier) (78). In addition, the output of this buffer amplifier (78) connects through two parallel configured back-to-back diodes (79 and 81) (which provides the limiting control function (19)) to the loop filter (39) and also to the third switch (27). The output of the third switch (27) connects through a lowpass filter (44) comprised of a resistor and capacitor (82 and 83) and through another buffer amplifier (84) to the analog to digital converter (42) (FIG. 2) described above.

Referring again to the second counter (17), the output thereof also connects to the clock input of a D type flip-flop (86), the data port of which connects to a positive reference source and the not Q output of which provides the hold signal referred to above, which hold signal provides the control signal to the first and second switches (24 and 26).

The output of the second counter (17) also connects through a divide-by-2048 counter (87), the output of which connects to the clock input of a second D type flip-flop (88), the data port of which connects high and the Q output of which provides the update signal described above, which update signal is provided to the third switch (27). Due to the inclusion of the divide-by-2048 counter (87), the update signal will ordinarily lag the not hold signal by a period of time. This allows the system to lock in and thereby avoid feeding fluctuating data to the memory stage (23).

The control logic of this embodiment also includes a number of logic gates to control the reset function. More particularly, 2 two input AND gates (89 and 91), 1 two input OR gate (92), 1 three input NOR gate (93), and 1 inverter (94) are configured to receive a microprocessor override input (96), a transmit/receive indicator signal (97), a squelch detect signal (98), and a loss of lock indicator signal (99), and to respond to any of these signals by providing a reset signal to the first and second counters (16 and 17), the phase frequency detector (18), the two D type flip-flops (86 and 88) that provide the hold and update signals, and the counter (87) that generates the lag in the update signal.

Figure 6:
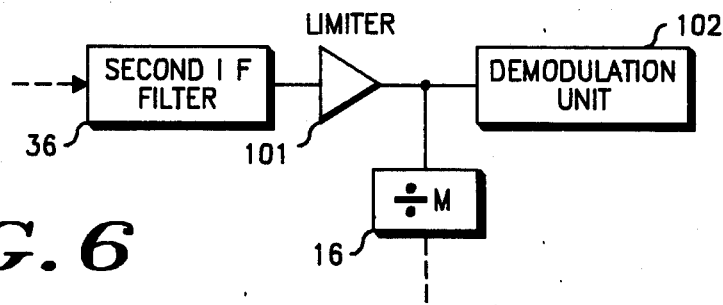
FIG. 6 comprises a block diagram of an alternative embodiment.

The above described invention functions to provide an easily manufacturable, relatively inexpensive, and reliable mobile transceiver having a reliably accurate transmission frequency suitable for use in applications requiring narrow channel spacing. Those skilled in the art will recognize that various modifications and changes could be made with respect to the above described embodiments without departing from the spirit and scope of the invention. For example, with reference to FIG. 6, the output of the second IF filter (36) of the reception unit (11) could be passed through a limiter (101) before being provided to a demodulation unit (102) of choice. The output of the limiter (101) could also be provided to the input of the first counter (16) described above. So connected, the first counter (16) would function to divide down the IF carrier signal, and the adaptive reference oscillator features described above would substantially result. Although this embodiment would not generally provide results as consistantly superior as the first embodiment described above, for many applications such an embodiment would prove to be acceptable.

It should therefore be well understood that the claims are not to be considered as being limited to the precise embodiments set forth, in the absence of specific limitations directed to such embodiments.

We claim:

1. A radio transceiver having:
reception means for receiving a first RF signal of interest, said first RF signal including at least a reception carrier signal having a predetermined frequency;
transmission means for transmitting a second RF signal of interest, said second RF signal including at least a transmission carrier signal having a predetermined frequency;
intermediate frequency means for receiving said reception carrier signal and for converting said reception carrier signal into an intermediate frequency signal;
phase lock loop FM detector means for responding to said intermediate frequency means for detecting modulated information on said intermediate frequency signal, said phase lock loop FM detector means including a voltage controlled oscillator that provides an output signal;
phase lock loop reference oscillator means for providing a reference signal output for use by both said reception means and said transmission means, said phase lock loop reference oscillator means including:
first counter means for receiving said reference signal output and for effectively dividing said reference signal output by a predetermined amount to provide a divided reference signal output;
second counter means for receiving said output signal of said voltage controlled oscillator and for effectively dividing said output signal by a predetermined amount to provide a divided output signal output;
phase frequency detector means for comparing said divided reference signal output with said divided output signal output to determine any phase frequency difference therebetween;
reference oscillator means for responding to said phase frequency detector means by providing said reference signal output.

2. The radio transceiver of claim 1 wherein said phase lock loop reference oscillator means includes limit control means for limiting the response of said reference oscillator means to said phase frequency detector means.

3. The radio transceiver of claim 1 wherein said phase lock loop reference oscillator means includes memory means for storing information related to said phase frequency difference between said divided reference signal output and said divided output signal output.

4. The radio transceiver of claim 3 wherein said memory means can be selectively switched between:
a write mode for updating said information related to said phase frequency difference from time to time; and
a read mode for providing said information stored in said memory means to said reference oscillator means.

5. The radio transceiver of claim 4 and further including switch means for selectively switching said memory means between said read mode and said write mode.

6. The radio transceiver of claim 1 wherein said phase frequency detector means includes loop filter means for receiving an output signal related to said phase frequency difference and for substantially integrating said phase frequency difference.

7. A radio transceiver having:
   reception means for receiving an RF signal of interest;
   transmission means for transmitting an RF signal of interest;
   detector means operably connected to respond to said reception means, for detecting information modulated on said received RF signal of interest, if any, said detector means including a voltage controlled oscillator that provides an output signal;
   adaptive reference oscillator means for providing a reference signal output for use by both said reception means and said transmission means, said adaptive reference oscillator means including:
      phase frequency detector means for receiving and comparing said output signal and said reference signal output, and for providing a control signal;
      reference oscillator means for responding to said control signal by providing said reference signal output;
      memory means for selectively receiving said control signal, for storing at least one reliable value of said control signal, and for providing a reliable value of said control signal to said reference oscillator means to control said reference signal output when said radio transceiver transmits said RF signal of interest.

8. The radio transceiver of claim 7, wherein said memory means further functions to provide a reliable value of said control signal to said reference oscillator means whenever said control signal at least exceeds a predetermined range for a predetermined period of time.

9. The radio transceiver of claim 8, wherein said memory means further functions to dynamically update said predetermined range from time to time.

10. The radio transceiver of claim 9 wherein said memory means further functions to only dynamically vary said predetermined range within predetermined limits.

11. The radio transceiver of claim 10 wherein said memory means further functions to provide a reliable value of said control signal to said reference oscillator means whenever said predetermined range exceeds said predetermined limits.

12. The radio transceiver of claim 7 wherein said memory means will update at least one of said stored reliable values of said control signal from time to time so long as said phase frequency detector means control signal controls said reference oscillator means.

13. The radio transceiver of claim 12 wherein said memory means will not update said stored reliable value of said control signal until at least a minimum predetermined period of time has elapsed following initation of provision of said control signal to said reference oscillator means from said phase frequency detector means.

14. A radio transceiver having:
   reception means for receiving an RF signal of interest;
   transmission means for transmitting an RF signal of interest;
   detector means operably connected to respond to said reception means, for detecting information modulated on said received RF signal of interest, said detector means including a voltage controlled oscillator that provides an output signal;
   adaptive reference oscillator means for providing a reference signal output for use by both said reception means and said transmission means, said adaptive reference oscillator means including:
      first counter means for receiving said reference signal output and for effectively dividing said reference signal output by a predetermined amount to provide a divided reference signal output;
      second counter means for receiving said output signal of said voltage controlled oscillator and for effectively dividing said output signal by a predetermined amount to provide a divided output signal output;
      phase frequency detector means for receiving and comparing said divided output signal and said divided reference signal output, and for providing a control signal related to phase frequency difference between said signals;
      reference oscillator means for responding to said control signal by providing said reference signal output;
      memory means for selectively receiving said control signal, for storing a most recent reliable value of said control signal, and for providing said most recent reliable value of said control signal to said reference oscillator means to control said reference signal output when said transmission means transmits said RF signal of interest.

15. A method of determining a transmission frequency in a radio transceiver having reception means for receiving an RF signal of interest, said RF signal including at least a reception carrier signal having a predetermined frequency, transmission means for transmitting an RF signal of interest, said RF signal including at least a transmission carrier signal having a predetermined frequency, and detector means for detecting modulated information, on said reception carrier signal, said detector means including a voltage controlled oscillator that provides an output signal, the method comprising the steps of:
   (a) providing a reference oscillator that provides a reference output signal for use by both said reception means and said transmission means;
   (b) comparing a first signal related to said output signal of said voltage controlled oscillator with a second signal related to said reference output signal to determine phase difference between said signals and for providing a control signal to said reference oscillator based thereon;
   (c) retaining a most recent reliable value of said control signal in a memory;
   (d) providing said most recent reliable value of said control signal to said reference oscillator when said transmission means transmits to aid in determining said frequency of said transmission carrier signal.

16. The method of claim 15 and further including the step of providing said most recent reliable value of said control signal to said reference oscillator whenever said control signal at least exceeds a predetermined range.

17. The method of claim 16 wherein said most recent reliable value of said control signal is provided to said reference oscillator whenever said control signal at least exceeds said predetermined range for a predetermined period of time.

* * * * *